US006842019B1

(12) United States Patent
de Jong et al.

(10) Patent No.: US 6,842,019 B1
(45) Date of Patent: Jan. 11, 2005

(54) STRUCTURES AND METHODS FOR DETERMINING THE EFFECTS OF HIGH STRESS CURRENTS ON CONDUCTING LAYERS AND CONTACTS IN INTEGRATED CIRCUITS

(75) Inventors: Jan L. de Jong, Cupertino, CA (US); Zicheng G. Ling, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 10/787,332

(22) Filed: Feb. 26, 2004

Related U.S. Application Data (62) Division of application No. 10/109,744, filed on Mar. 28, 2002, now Pat. No. 6,727,710.

(51) Int. Cl.[7] .......................... G01R 31/26; G01R 27/08
(52) U.S. Cl. ....................................... 324/719; 324/713
(58) Field of Search ................................. 324/719, 522, 324/532, 761–765, 158.1, 713; 438/14, 15, 17, 18; 327/50–56; 365/207, 208, 191, 195, 196

(56) References Cited

U.S. PATENT DOCUMENTS

| | | | |
|---|---|---|---|
| 6,144,214 A | 11/2000 | Athan | 324/763 |
| 6,281,696 B1 | 8/2001 | Voogel | 324/765 |
| 6,313,657 B1 | 11/2001 | Hashimoto | 324/763 |
| 6,503,765 B1 * | 1/2003 | Chao et al. | 438/14 |

\* cited by examiner

*Primary Examiner*—Vincent Q. Nguyen
(74) *Attorney, Agent, or Firm*—Lois D. Cartier (57) ABSTRACT

A method of testing reliability in an integrated circuit including an array of test circuits, each test circuit including a resistor. The method includes selecting a first test circuit from the array, measuring a pre-stress resistance value for the resistor in the selected test circuit, applying a high stress current across the resistor, removing the high stress current, and measuring a post-stress resistance value for the resistor. Other embodiments include measuring additional resistance values before applying and after removing the high stress current. One embodiment includes applying a positive voltage to one stress input terminal, and then testing a short sensing terminal for the positive voltage, both before and after applying the high stress current. These steps test for whether or not the high stress current has created a short in the test circuit.

12 Claims, 6 Drawing Sheets

STRUCTURES AND METHODS FOR DETERMINING THE EFFECTS OF HIGH STRESS CURRENTS ON CONDUCTING LAYERS AND CONTACTS IN INTEGRATED CIRCUITS

This application is a Divisional of U.S. Ser. No. 10/109,744 filed Mar. 28, 2002, now U.S. Pat. No. 6,727,710.

FIELD OF THE INVENTION

The invention relates to test circuits and methods in integrated circuits (ICs). More particularly, the invention relates to circuits and methods for determining the effects of high stress currents on conducting layers, contacts, and vias in ICs.

BACKGROUND OF THE INVENTION

Integrated circuits (ICs) typically include numerous elements that are fabricated on silicon wafers. During the fabrication process, a "sandwich" of various conducting and non-conducting layers is laid down on a silicon wafer substrate. The conducting layers typically include layers of diffusion (wherein a chemical substance is diffused into the silicon substrate) and polysilicon, as well as several metal layers. The conducting layers are isolated from each other using intermediate layers of non-conducting material (e.g., silicon-dioxide), and electrically connected to one another by way of openings in these isolating layers. By convention, these openings are called "contacts" when the connection is between a diffusion layer or a polysilicon layer and the bottommost metal layer, and "vias" when the connection is between two different metal layers.

During the fabrication process, various types of manufacturing defects can occur. For example, a "short" (a short circuit) can appear between two layers of the same type. A short is an inadvertent electrical connection between two constructs. A metal short can occur, for example, when excess metal is laid down during processing such that each metal structure is slightly larger than it is intended to be. Because there are great advantages to using the smallest possible structures in designing an IC, wafer fabrication plants typically push the envelope by defining minimum separations that are the smallest feasible. Therefore, shorts are a common type of defect in integrated circuits.

Another type of defect commonly found in ICs is an "open"@ (an open circuit). An open is an inadvertent disconnect between two points designed to be electrically connected. A metal open can occur, for example, when insufficient metal is deposited in a particular location along a narrow metal line. In this case, a portion of the narrow metal line can effectively disappear from an IC and little or no current is conducted along that portion of the metal line.

An open can also occur in a via or contact (i.e., an opening in the non-conducting layer), when, for example, the contact or via etch is insufficiently deep to reach the underlying conducting layer. Also common are "partial opens" or resistive contacts and vias, where only a very small area contacts the underlying conducting layer or some degradation of the conducting material in the contact or via has occurred. Resistive contacts and vias not only affect the circuit speed and functionality, but are also considered unreliable, because they tend to become more open (more resistive) after the application of high currents.

Methods have been devised to test the processing of a silicon wafer by including a "test chip" at various points on the wafer. The test chip (also called a "Defect Monitor Vehicle", or DMV) includes structures intended for the purpose of testing for shorts and opens. If shorts and opens are found when testing the DMV, it is logical to assume that similar defects will be found in the other ICs on the wafer. Because the DMV is quick and easy to test, valuable test time is saved by discarding wafers that include high numbers of shorts and opens in the DMVs. Additionally, the DMVs can be used to track down problem areas in the fabrication process.

Voogel describes one such Defect Monitor Vehicle in U.S. Pat. No. 6,281,696 B1, which is incorporated herein by reference. Voogel's DMV contains a core array that includes interleaved "fork" structures for detecting shorts and serpentine structures for detecting opens in diffusion, polysilicon, and metal layers. Voogel also shows and describes switches, decoders, and control circuitry for selectively testing each of these elements within the core array.

Voogel's test structure is useful in detecting and locating shorts and opens generated during the IC fabrication process. However, Voogel's test structure does not detect resistive contacts and vias, because the effect of a single resistive point in an array is often too small to be noticed. Also, it is not possible to send large currents through the resistive chains in Voogel's array, because the total resistance of the chain is too high. To apply a large current to such a chain would require a voltage far exceeding what the control transistors can handle.

Therefore, to test for resistive contacts and vias requires an improvement to the accuracy of measuring the resistance of a resistive chain (e.g., the metal line or contact or via chain). Preferably, the resistance measurement should be accurate to within a few percentage points. Any structure that has more than a few percentage points of change in resistance value (i.e., enough change to be measured accurately) probably contains at least one resistive contact or via that has changed in value.

It is also desirable to allow for higher current stresses of the resistive structures in order to monitor the effect of the higher currents on the structures.

Any high speed switching circuitry within an IC has metal lines, contacts, and vias that conduct large amounts of current for a short time. For example, when the input signal driving an inverter changes state, both the N and P channel transistors in the inverter are momentarily on at the same time, causing a "crossbar current". Also, there is a high current flow through one of the N and P channel transistors as the capacitive load of the inverter is charged. These high current stresses can change the resistance of the conducting layers in an IC, which can adversely affect the timing and even the functionality of the IC. The high current stresses can also reshape the structures forming the IC circuits, causing additional shorts and opens that were not present after wafer fabrication.

Therefore, it is desirable to provide structures and methods for detecting and locating changes in resistance and/or shorts in ICs that have been subjected to high current stress.

SUMMARY OF THE INVENTION

The invention provides a Reliability Monitor Vehicle (RMV), a test chip that is included in an IC wafer for the purpose of testing the reliability of ICs on the wafer under high current stress. The RMV and the related methods of the invention provide a vehicle both for debugging a semiconductor fabrication process and for predicting the behavior under stress of other ICs on the same wafer.

According to a first embodiment of the invention, an IC test circuit is provided that includes two stress input terminals, two sense terminals, two sensing transistors, a select transistor, and a resistor. The two ends of the resistor are coupled to the two sense terminals through the two sensing transistors. One end of the resistor is also coupled to one of the stress input terminals; the other end of the resistor is coupled to the other stress input terminal through the select transistor. When the test circuit is selected, the sensing and select transistors are turned on. A current path is formed between the two stress input terminals, and the voltage differential can be measured across the resistor using the two sense terminals.

The term "resistor" as used herein means a structure in an IC having a measurable resistance. A resistor can be, for example, a conductive line in a single fabrication layer, such as a long metal line, or a combination of several different fabrication layers. For example, a resistor can include a contact or via chain, e.g., a chain of same layer contacts or vias connecting two alternating metal lines.

In one embodiment, the test circuit is a system that includes a current source for applying either a low non-stressing current or a high stress current between the two stress input terminals. Also included in the system is a voltage meter coupled to the two sense terminals that can be used to measure the voltage across the resistor. The resistance value of the resistor before, during, and/or after stress is applied can easily be derived from the applied currents and measured voltages.

Some embodiments of the invention provide additional resistors coupled between the stress terminals and the sense terminals. The additional resistors can be, for example, of different fabrication layers, or the same fabrication layer but with different dimensions (e.g., width, length, spacing, or overlapping of vias or contacts).

Another embodiment includes one or two additional resistors paralleling the first resistor and manufactured from the same fabrication layer. These additional resistors are used to test for short circuit conditions after application of the high stress current.

Another aspect of the invention provides a system for testing reliability in an IC. The system includes a core cell array of test circuits, row and column select circuits, global stress lines, and global sense lines. A first set of column switches is coupled between the core cell array and the global stress lines, which are used to supply a high stress current to a selected column of test circuits in the core cell array. All selected rows in the selected column receive the high stress current. A second set of column switches is coupled between the core cell array and the global sense lines, which are used to test the resistance through a selected test circuit before and after application of the high stress current. Again, the row select circuit determines which test circuit in the selected column is measured.

Other embodiments include local stress and sense lines coupled to each column of test circuits in the core cell array, and/or a short detector circuit. In some embodiments, the row and column select circuits are implemented using decoders. In other embodiments, one or both of the row and column select circuits are implemented as shift registers that cycle sequentially through each row or column in the array.

Another aspect of the invention provides a method of testing reliability in an IC including an array of test circuits, each test circuit including a resistor. The method includes selecting a first test circuit from the array, measuring a pre-stress resistance value for the resistor in the selected test circuit, applying a high stress current across the resistor, removing the high stress current, and measuring a post-stress resistance value for the resistor.

Other embodiments include measuring additional resistance values before applying and after removing the high stress current. For example, a pre-stress resistance value can be measured for each of several test circuits by selecting each test circuit in turn, applying a current through the resistor of the selected test circuit, and measuring a pre-stress voltage differential between the two sense terminals of the selected test circuit. Then, each test circuit can be selected and stressed by applying a high stress current across the resistor. Finally, each test circuit can be selected and a post-stress resistance value can be measured for each test circuit.

One embodiment includes applying a positive voltage to one stress input terminal, and then testing a short sensing terminal for the positive voltage, both before and after applying the high stress current. These steps test for whether or not the high stress current has created a short in the test circuit. It is not necessary to test separately for opens through the resistor after applying the high stress current. Measuring the post-stress resistance will detect any open circuits in the resistor by returning an infinite resistance value.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
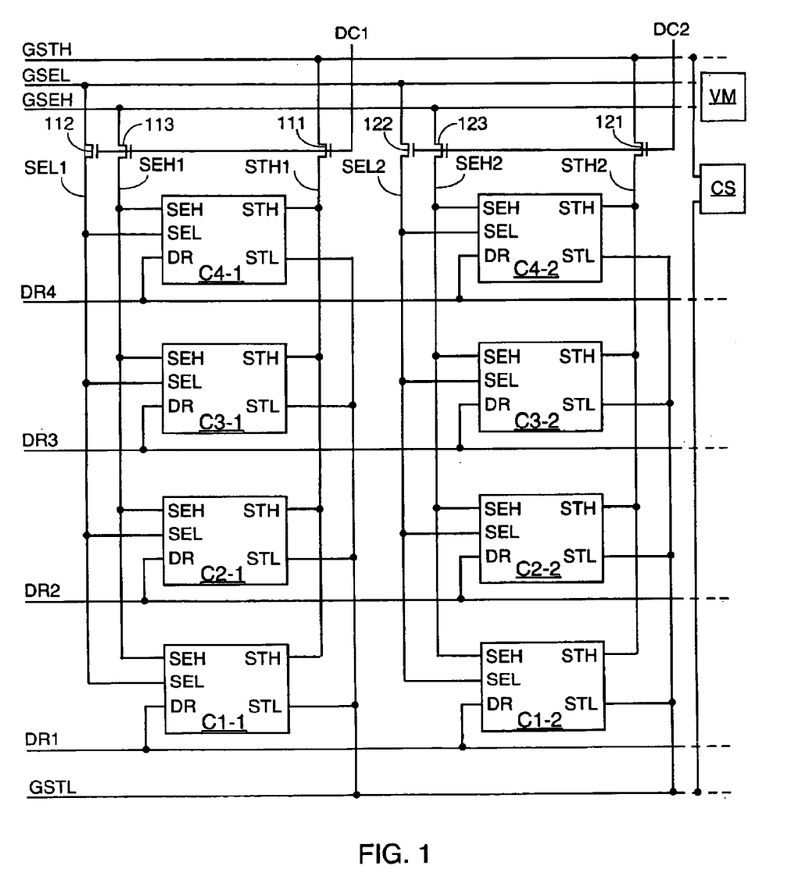
FIG. 1 shows a portion of a test chip according to a first embodiment of the invention that includes two columns and four rows of test circuits.

FIG. 1 shows a portion of a test chip according to a first embodiment of the invention that includes two columns and four rows of test circuits. The size of the portion shown is purely exemplary. Test chips implementing the invention can be smaller or larger than the pictured example.

The test chip portion shown in FIG. 1 includes test circuits C1-1, C2-1, C3-1, and C4-1 arranged in a first column and test circuits C1-2, C2-2, C3-2, and C4-2 arranged in a second column. One embodiment of these test circuits is shown in FIG. 1A.

Figure 1A:
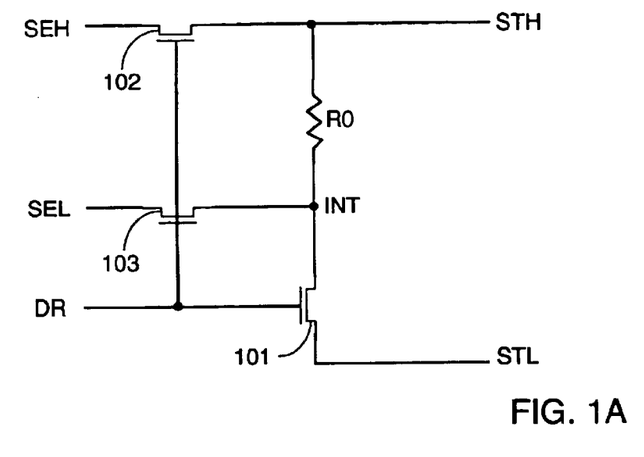
FIG. 1A shows one implementation of the test circuits from FIG. 1.

As shown in FIG. 1A, the test circuit includes stress input terminals STH and STL, sense terminals SEH and SEL, and row select terminal DR. Resistor R0 is coupled between stress input terminal STH and internal node INT, which is in turn coupled to stress input terminal STL through select transistor 101. Stress input terminal STH (and thus one terminal of resistor R0) is coupled to sense terminal SEH through sensing transistor 102. Internal node INT (and thus the other terminal of resistor R0) is coupled to sense terminal SEL through sensing transistor 103. The gate terminals of transistors 101–103 are all coupled to row select terminal DR.

As can be seen from FIG. 1A, resistor R0 can be stressed by applying a high stress current between stress input terminals STH and STL. To handle the resulting high current flow, select transistor 101 is preferably made very wide. In one embodiment, select transistor 101 is 25 microns in width and 0.26 microns in length.

By measuring the resistance of resistor R0 both before and after applying the high stress current, the effect of the resulting high current stresses on resistor R0 can be evaluated. The resistance of resistor R0 can be measured by applying a low current (i.e., a non-stressing current) between stress input terminals STH and STL and measuring the voltage differential between sense terminals SEH and SEL using the external voltage meter VM in FIG. 1. The resistance R0 is then easily derived from the applied current and measured voltage values.

In one embodiment, a current is applied using a current source CS, and the voltage differential is measured using a voltage meter VM, coupled to the test circuit as shown in FIG. 1. Current source CS and voltage meter VM are preferably external to the test circuit, and are coupled to the test circuit through wires and probe tips. Current source CS and voltage meter VM are also preferably connected to a computer, which runs the test program that determines the current levels forced by CS and collects the voltage measurements taken by voltage meter VM.

Because only a small amount of current flows through the sensing transistors (i.e., only enough current to charge the sense lines), sensing transistors 102–103 can be relatively narrow. For example, in one embodiment, transistors 102 and 103 are 4 microns in width and 0.26 microns in length.

Returning to FIG. 1, current source CS can be used to apply a high stress current between global stress lines GSTH and GSTL. Each column of test circuits has a local stress line STHx. Global stress line GSTH is coupled to each local stress line STHx through a corresponding transistor controlled by column select signal DCx. (In the present specification, the same reference characters are used to refer to terminals, signal lines, and their corresponding signals.)

For example, the first column of test circuits C1-1 through C4-1 has a local stress line STH1. Local stress line STH1 is coupled to global stress line GSTH through transistor 111, which is controlled by column select signal DC1.

Thus, when the first column is selected, column select signal DC1 is high, and global stress line STH1 is coupled to the STH terminal of each of test circuits C1-1 through C4-1. Any test circuit C1-1 through C4-1 that also has a high row select signal DRx is stressed.

A relatively high current passes through transistor 111 when the test circuits of the first column are stressed. Therefore, this transistor is preferably made very wide, and with a larger-than-minimum length. For example, in one embodiment transistor 111 is 50 microns in width and 0.26 microns in length.

In one embodiment, a single row of test circuits is stressed simultaneously across several columns. In this embodiment, all columns are identical, with different resistors being used in each row. To stress many identical resistors with a single application of high stress current (i.e., to subject the identical resistors to the same amount of stressing), an entire row or a partial row of test circuits is stressed at the same time with the same high current application.

Each column of test circuits also has a pair of local sense lines SEL1 and SEH1. Global sense line GSEL is coupled to each local sense line SELx through a corresponding transistor controlled by column select signal DCx. Global sense line GSEH is coupled to each local sense line SEHx through a corresponding transistor also controlled by column select signal DCx.

For example, in the first column of test circuits, local sense line SELL is coupled to global sense line GSEL through transistor 112, which is controlled by column select signal DC1. Similarly, local sense line SEH1 is coupled to global sense line GSEH through transistor 113, which is controlled by column select signal DC1.

Thus, when the first column is selected, column select signal DC1 is high, and global sense lines GSEL and GSEH are coupled to the SEH and SEL terminals, respectively, of each of test circuits C1-1 through C4-1. However, referring to FIG. 1A, it can be seen that unless row select signal DR is high for a particular test circuit, there is no path between the two sense terminals SEH and SEL. Therefore, voltage meter VM measures a resistance only through the one test circuit having a high value on both the corresponding column select signal DCx and the corresponding row select signal DRy.

Because only a small amount of current flows through the sensing transistors during the resistance measurement process (i.e., only enough current to charge the sense lines), transistors 112 and 113 can be relatively narrow. For example, in one embodiment, transistors 112 and 113 are 4 microns in width and 0.26 microns in length.

Each test circuit in FIG. 1 (or each column or row of test circuits) can be different from the others, if desired. For example, the resistor in each test circuit can be on a different fabrication layer or layers, or two test circuits can have resistors formed using the same fabrication layer or layers, but having different dimensions (e.g., different widths) or varying structural relationships. For example, in some test circuits the resistors include metal lines that are narrower than the vias, while in other test circuits the resistors include metal lines that are wider than the vias. Thus, a single column, or a group of columns, of test circuits can be used to test a number of different fabrication layers, different dimensions, and/or different structures.

For example, in one embodiment a test chip includes 896 identical columns, each of which includes 31 rows of test circuits. In this embodiment, a shift register is used to implement the column select circuit, so the number of columns is arbitrary. The row select circuit, on the other hand, is implemented using a decoder. The 31 test circuits in each column include resistors in diffusion, polysilicon, and 9 different metal layers, including various widths and structures. Also included in the various structures of the resistors are the contacts and vias needed to complete the electrical connections through the various conductive layers. Therefore, stressing these resistors allows the testing of structures similar to those that would actually be exercised in a production IC while in use.

Including a number of identical columns of test circuits enables the simultaneous stressing of several identical test circuits, by applying a stress current to one or more rows (or partial rows) of test circuits at one time. Because the columns are identical, each test circuit in a row of test circuits in these columns receives about the same amount of stress current, which allows for a more accurate prediction of reliability under stress than would testing a single resistor in a single test circuit. However, the invention also encompasses other test chip designs. Some embodiments of the invention include multiple columns or even entire arrays of individualized test circuits.

Figure 2:
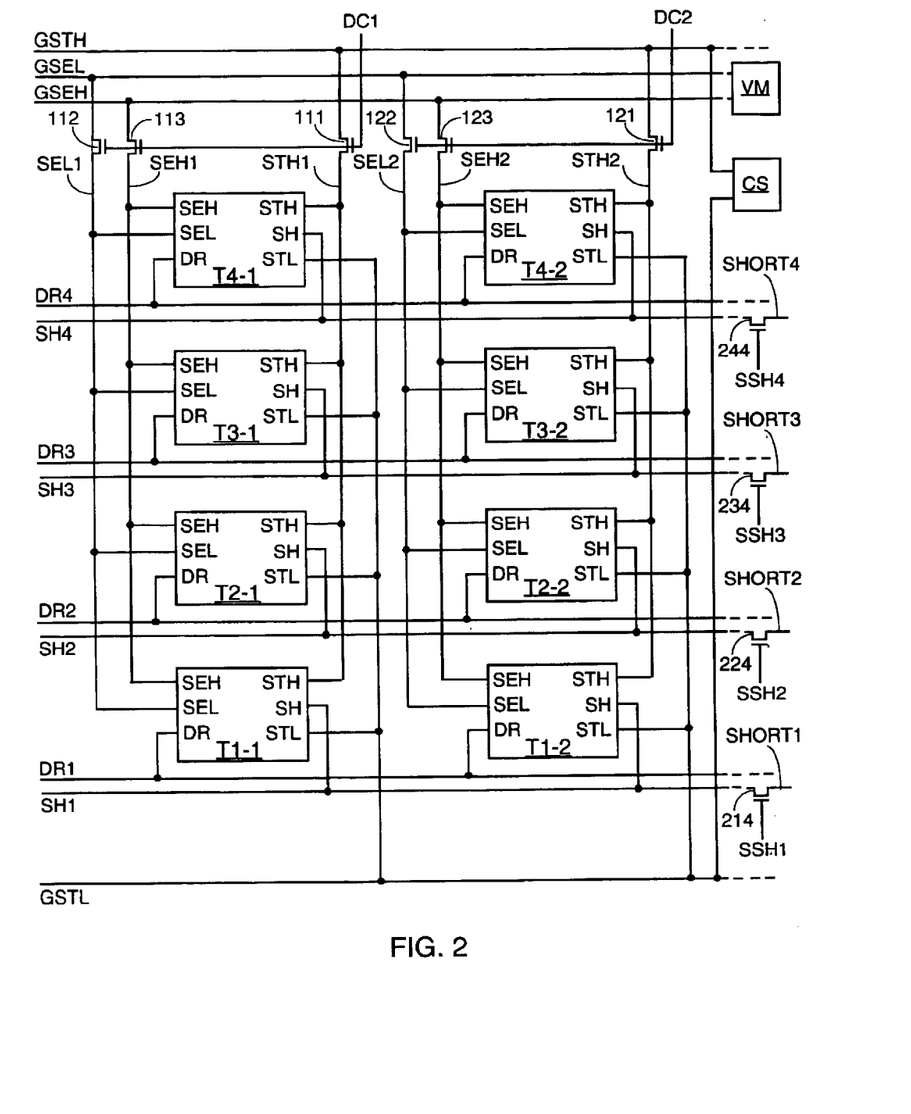
FIG. 2 shows a portion of a test chip according to a second embodiment of the invention that enables testing for shorts before and after stressing the test circuit.

FIG. 2 shows a portion of another test chip according to a second embodiment of the invention. The structure shown in FIG. 2 also enables testing for shorts after stressing the test circuits in one or more columns. Much of the structure shown in FIG. 1 is duplicated in FIG. 2. Therefore, only those portions that are different are described.

The test chip portion shown in FIG. 2 includes a short sensing line for each row, coupled through a transistor to a short sensing terminal. For example, the first (bottom) row includes a short sensing line SH1, coupled through transistor 214 to short sensing terminal SHORT1. Transistor. 214 is controlled by a short select signal SSH1, which can be supplied, for example, by a short detection select circuit. The short sensing line for each row is coupled to a short sensing terminal SH of each test circuit in the row.

Figure 2A:
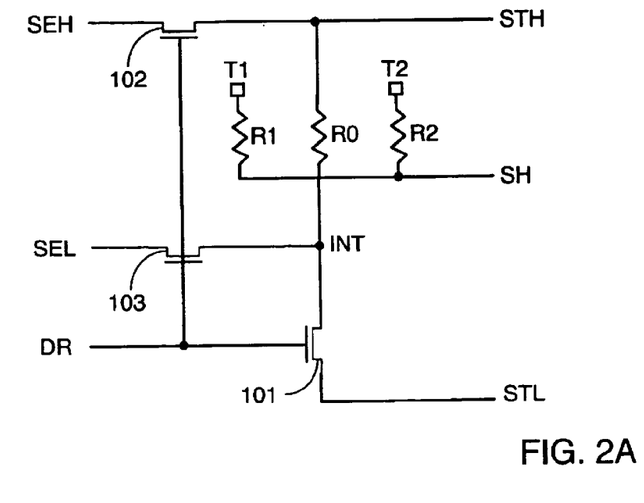
FIG. 2A shows one implementation of the test circuits from FIG. 2.

FIG. 2A shows one embodiment of a test circuit that can be used with the embodiment of FIG. 2. The test circuit of FIG. 2A differs from that of FIG. 1A by the addition of two resistors R1 and R2, one on either side of resistor R0 and paralleling resistor R0. Each of resistors R1 and R2 terminates at a terminal T1 and T2, respectively, with the other end of each resistor being coupled to the short sensing terminal SH of the test circuit.

Note that resistors R2 and R3 are not deliberately coupled to resistor R0, or to any other elements in the test circuit. Thus, if an electrical connection is present after stressing resistor R0 by the application of a high stress current between the two stress terminals, then an undesirable short has occurred. Resistor R0 (and, by inference, other resistors on the same wafer that are similar to resistor R0) is not reliable under stress.

Figure 3:
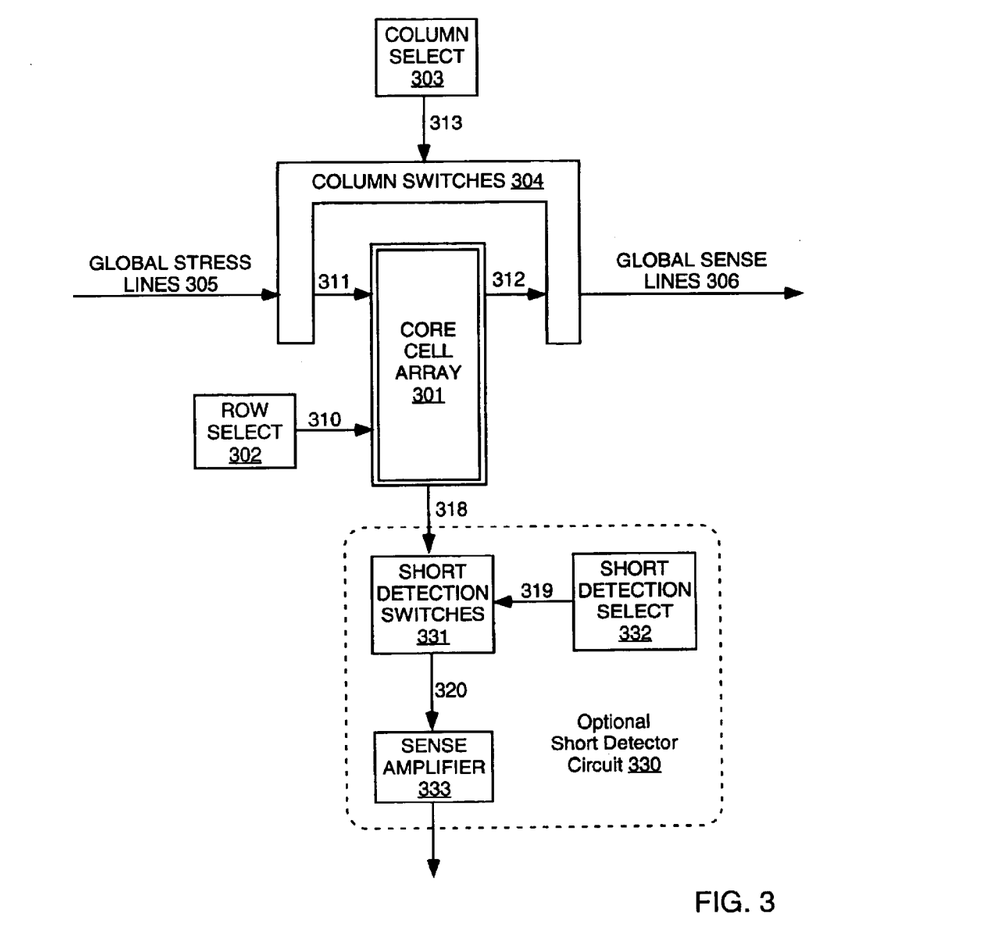
FIG. 3 shows a system for testing an integrated circuit (IC) according to another aspect of the invention.

FIG. 3 shows a system for testing reliability in an IC. This system can include, for example, the structures of FIGS. 1, 1A, 2, and/or 2A. However, other implementations of the elements in FIG. 3 are also encompassed by the invention. The system of FIG. 3 includes a core cell array 301, which includes rows and columns of test circuits, a row select circuit 302, a column select circuit 303, column switches 304, global stress lines 305, and global sense lines 306.

Row select circuit 302 selects one or more rows from the core cell array. Row select circuit 302 can be, for example, a decoder that decodes externally supplied signals to select one row in the array. In another embodiment, row select circuit 302 is a shift register, which cycles one at a time through the rows of test circuits in the array. Row select circuit 302 provides row select signals 310 to the core cell array 301. Row select signals 310 can be, for example, signals DR1–DR4 of FIGS. 1 and 2.

Column select circuit 303 selects one or more columns from the core cell array. Column select circuit 303 can be, for example, a decoder or a shift register. Column select circuit 303 provides column select signals 313 to the column switches 304. Column select signals 313 can be, for example, signals DC1–DC2 of FIGS. 1 and 2.

Column switches 304 selectively supply signals from global stress lines 305 to core cell array 301, and from core cell array 301 to global sense lines 306, under the control of column select signals 313. Between column switches 304 and core cell array 301 are local stress lines 311 and local sense-lines 312.

Column switches 304 can include, for example, transistors 111–113 and 121–123 of FIGS. 1 and 2. Global stress lines can include, for example, global stress lines GSTH and GSTL of FIGS. 1 and 2, while local stress lines 311 can include local stress lines STH1 and STH2 of FIGS. 1 and 2. Global sense lines can include, for example, global sense lines GSEL and GSEH of FIGS. 1 and 2, while local sense lines 312 can include local sense lines SEL1, SEH1, SEL2, and SEH2 of FIGS. 1 and 2.

The system of FIG. 3 also optionally includes a short detector circuit 330. Short detector circuit 330 includes a short detection select circuit 332, a set of short detection switches 331, and a sense amplifier 333. Short detection switches 331 are coupled between short sensing lines 318 from core cell array 301 and sense amplifier 333. Under the control of short detection select circuit 332, short detection switches 331 pass a selected short signal 320 to sense amplifier 333.

Short detection switches 331 can include, for example, transistors 214, 224, 234, and 244 of FIG. 2. Short sensing lines 318 can include, for example, short sensing lines SH1, SH2, SH3, and SH4 of FIG. 2. Short select signals 319 can include, for example, short select signals SSH1, SSH2, SSH3, and SSH4 of FIG. 2. Selected short signal 320 can include, for example, a signal from any of short sensing terminals SHORT1, SHORT2, SHORT3, and SHORT4 of FIG. 2.

In one embodiment, short detection select circuit 332 is the same as row select circuit 302, and the two circuits are implemented as a decoder. The decoder input signals determine which row is selected, while an additional input signal determines whether the row select signal or the short detection select signal becomes active.

Short detector circuit 330 can be used as follows, for example. After stressing a test circuit in core cell array 301, a positive voltage can be applied to one of the global stress lines 305, and hence to the local stress line 311 for the stressed test circuit. Column select circuit 303 and row select circuit 302 determine to which test circuit the positive voltage is applied. Short detection select circuit 332 can decode a value to select the appropriate short sensing line from the array (if implemented as a decoder) or cycle through each short sensing line (if implemented as a shift register). Selected short signal 320 is compared to ground (a zero voltage) in sense amplifier 333. If selected short signal 320 has a positive value, there is a short in the selected test circuit.

Figure 4:
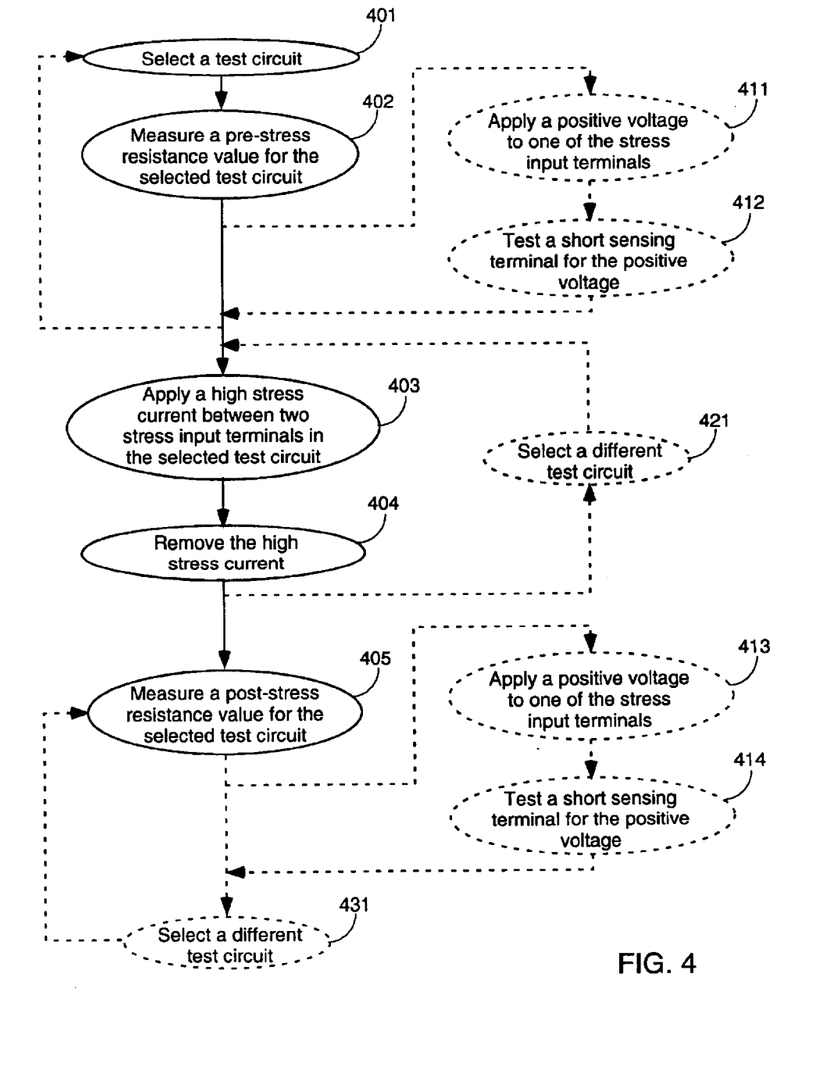
FIG. 4 shows a method of testing reliability in an IC, according to another aspect of the invention.

FIG. 4 shows a method of testing reliability in an IC. The method can be applied, for example, to structures similar to those of FIGS. 1–3. However, the illustrated method can also be used with other structures, and these uses fall within the scope of the present invention.

In step 401, a test circuit is selected from an array of test circuits, each including a resistor and a current path through the resistor. Selecting a test circuit can include, for example, the series of steps shown in FIG. 4A.

Figure 4A:
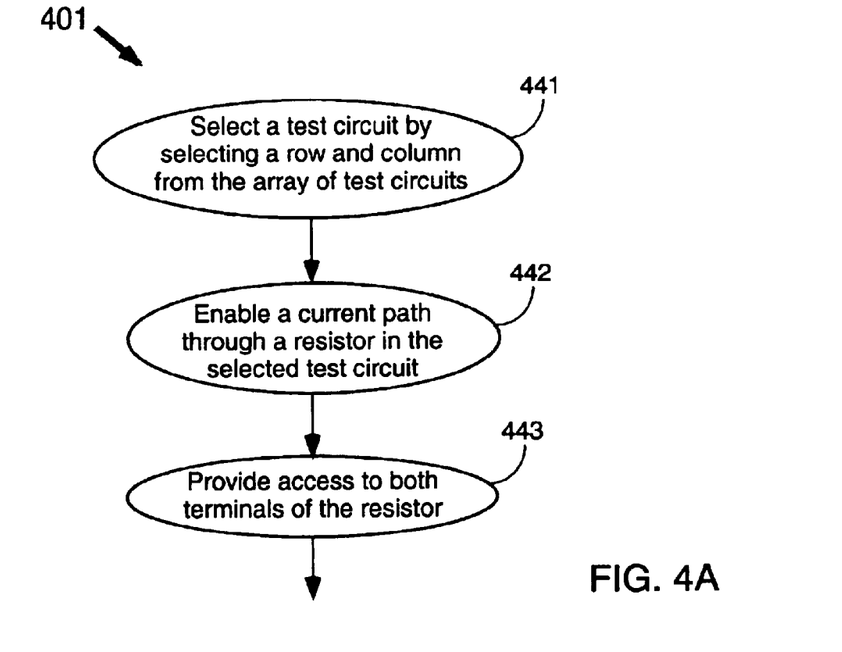
FIG. 4A shows the steps of selecting a test circuit according to one embodiment of the invention.

In step 441 of FIG. 1A, a row and column of test circuits are selected from the array, pinpointing the selected test circuit. In step 442, a current path through the selected test circuit is enabled. For example, a select transistor can be turned on by a high value on a row select signal and a column switch by a high value on a column select signal, completing the current path. In step 443, access is provided to both terminals of the resistor in the selected test circuit. For example, the high value on the row select signal can turn on two sensing transistors, while the high value on two more column switches can complete the access path from the resistor to two sensing terminals.

The steps shown in FIG. 4A need not occur in the order shown. For example, all three steps can occur essentially simultaneously.

Returning to FIG. 4, in step 402 a pre-stress resistance value is measured for the selected test circuit. Optionally, as shown by the dashed-line arrow returning to step 401, the selection and pre-stress measurement steps can be repeated for a series of test circuits. Measuring a resistance value can include, for example, the series of steps shown in FIG. 4B.

Figure 4B:
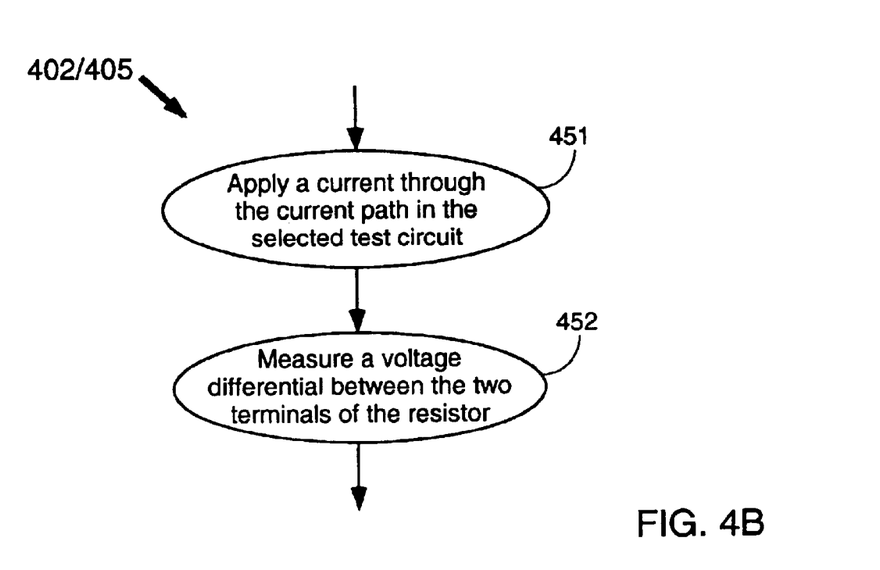
FIG. 4B shows the steps of measuring a resistance value for a selected test circuit according to one embodiment of the invention.

In step 451 of FIG. 4B, a relatively low, non-stressing current is applied through the current path in the selected test circuit. In step 452, a voltage differential is measured between the two terminals of the resistor.

Returning once more to FIG. 4, in step 403, after measuring the pre-stress resistance, a high stress current is applied between two stress input terminals of the selected test circuit. In step 404, the high stress current is removed. As indicated by the dashed line traversing optional step 421, a new test circuit can be selected and steps 403 and 404 can be repeated for a series of additional test circuits, if desired.

In step 405, a post-stress resistance value is measured for the selected test circuit. This measurement can also be made, for example, using the series of steps shown in FIG. 4B. As with step 402, additional test circuits can optionally be selected (step 431) and the post-stress measurement of step 405 can be repeated for a series of test circuits.

Four additional steps can optionally be added. In steps 411 and 413, a positive voltage is applied to one of the stress input terminals. In steps 412 and 414, a short sensing terminal of the selected test circuit is tested for a short condition between the short sensing terminal and the stress input terminal to which the high voltage is applied. Performing the short test both before and after applying the high stress current allows the determination of whether the short is created during the fabrication process (in which case the short is detected in step 412) or by the high current stressing itself (in which case the short is detected only in step 414). This capability is especially useful in debugging fabrication processes.

To detect a short caused by applying and removing the high stress current in steps 403 and 404, steps 411 and 412 must occur before these steps, and steps 413 and 414 must occur after these steps. However, steps 411 and 412 can occur prior to step 402, and steps 413 and 414 can occur prior to step 405, if desired.

In one embodiment, the steps of FIG. 4 are accomplished as follows. First, one row in an array of test circuits is selected for test (e.g., using a row select signal provided by a row select circuit). Within the selected row, the test circuits are selected one at a time (e.g., using a column select signal provided by a column select circuit). A pre-stress resistance value is measured for each selected test circuit in the row. The pre-stress resistance values for each test circuit are stored in a first computer file. These steps correspond to steps 401 and 402 in FIG. 4.

Once again, each test circuit in the row is selected, and this time each test circuit is tested for shorts. The pre-stress short information is added to the first computer file. These steps correspond to steps 411 and 412 in FIG. 4.

After testing for shorts, each test circuit in the row is stressed by applying a high stress current across a resistor in the test circuit for a measured period of time, then removing the high stress current. The stress current can be applied to all test circuits in the row simultaneously (by selecting the entire row), or to groups of test circuits (by selecting a portion of the row), or to each test circuit individually (by selecting one test circuit at a time). These steps correspond to steps 403, 404, and 421 in FIG. 4.

After applying the high stress current to each test circuit in the row, each test circuit in the row is selected and a post-stress resistance value is measured for each test circuit. The post-stress resistance values are stored in a second computer file. (In some embodiments, all resistance and short data is stored in a single computer file.) These steps correspond to steps 405 and 431 in FIG. 4.

Once again, each test circuit in the row is selected, and again each test circuit is tested for shorts. The post-stress short information is added to the second computer file. These steps correspond to steps 413 and 414 in FIG. 4.

In one embodiment, the entire process is repeated for the same row, applying progressively more stress time and/or stress current with each repetition, and storing the data in computer files each time. In this fashion, several different stress conditions can be tested on the same row of test circuits. In other embodiments, another row is selected, and the same or different stress conditions are applied to the next row, until data has been collected for all rows of interest.

When the measurements are complete, the data from the pre-stress and post-stress resistance and short measurements are compared to determine the effects of the high stress currents on the various resistor structures in the test circuit array. Resistors that have changed in value or have developed shorts are easily detected by this comparison.

Those having skill in the relevant arts of the invention will now perceive various modifications and additions that can be made as a result of the disclosure herein. For example, the above text describes the circuits and methods of the invention in the context of ICs fabricated on a silicon wafer using a CMOS process. However, the nature of the IC fabrication process is not material to the application of the circuits and methods presented herein. Therefore, the circuits and methods of the invention can also be applied to ICs fabricated using other processes and other types of wafers, both known and yet to be developed.

Further, resistors, transistors, switches, sense amplifiers, short detector circuits, short detection select circuits, row select circuits, column select circuits, decoders, shift registers, voltage meters, current sources, and other components other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A method of testing reliability in an integrated circuit (IC) including an array of test circuits, each test circuit including a resistor, the method comprising:

selecting a first test circuit from the array of test circuits, the first test circuit comprising a first current path traversing a first resistor in the first test circuit;

measuring, after selecting the first test circuit, a first pre-stress resistance value for the first resistor;

applying, after measuring the first pre-stress resistance value, a first high stress current through the first current path;

removing the first high stress current from the first current path; and measuring, after removing the first high stress current, a first post-stress resistance value for the first resistor.

2. The method of claim 1, further comprising de-selecting the first test circuit after measuring the first post-stress resistance value.

3. The method of claim 1, further comprising:

de-selecting the first test circuit;

selecting a second test circuit from the array of test circuits, the second test circuit comprising a second current path traversing a second resistor in the second test circuit;

measuring, after selecting the second test circuit, a second pre-stress resistance value for the second resistor;

de-selecting the second test circuit; and re-selecting the first test circuit.

4. The method of claim 3, wherein de-selecting the first test circuit, selecting the second test circuit, measuring the second pre-stress resistance value, de-selecting the second test circuit, and re-selecting the first test circuit occur after measuring the first pre-stress resistance value and before applying the first high stress current.

5. The method of claim 3, further comprising:

de-selecting the first test circuit;

re-selecting the second test circuit;

applying a second high stress current through the second current path;

removing the second high stress current from the second current path;

de-selecting the second test circuit; and re-selecting the first test circuit.

6. The method of claim 5, wherein de-selecting the first test circuit, re-selecting the second test circuit, applying the second high stress current, removing the second high stress current, de-selecting the second test circuit, and re-selecting the first test circuit occur after removing the first high stress current from the first current path and before measuring the first post-stress resistance value for the first resistor.

7. The method of claim 5, further comprising, after measuring the first post-stress resistance value for the first resistor:

de-selecting the first test circuit;

re-selecting the second test circuit; and measuring a second post-stress resistance value for the second resistor.

8. The method of claim 7, wherein de-selecting the first test circuit, re-selecting the second test circuit, and measuring the second post-stress resistance value occur after measuring the first post-stress resistance value.

9. The method of claim 1, wherein:

selecting the first test circuit comprises:

selecting a first row and a first column from the array, the first test circuit being in the first row and the first column, enabling the first current path through the first test circuit, and providing access to first and second terminals of the first resistor; and deselecting the first test circuit comprises:

disabling the first current path through the first test circuit, and removing access to the first and second terminals of the first resistor.

10. The method of claim 1, wherein:

measuring the first pre-stress resistance value for the first resistor comprises applying a first non-stressing current through the first current path and measuring a first voltage differential between the first and second terminals of the first resistor; and measuring the first post-stress resistance value for the first resistor comprises applying a second non-stressing current through the first current path and measuring a second voltage differential between the first and second terminals of the first resistor.

11. The method of claim 1, wherein each test circuit further includes a short testing structure, the method further comprising:

testing, before applying the first high stress current, for a pre-stress short between the first resistor and the short testing structure; and testing, after applying the first high stress current, for a post-stress short between the first resistor and the short testing structure.

12. The method of claim 11, wherein each of testing for the pre-stress short and testing for the post-stress short comprises:

applying a positive voltage level at one end of the first current path; and checking for the positive voltage level on the short testing structure.

* * * * *